United States Patent

Chin et al.

[11] Patent Number: 5,818,716
[45] Date of Patent: Oct. 6, 1998

[54] DYNAMIC LOT DISPATCHING REQUIRED TURN RATE FACTORY CONTROL SYSTEM AND METHOD OF OPERATION THEREOF

[75] Inventors: Wen-Cheng Chin, Hsinchu; Jiann-Kwang Wang, Hsiu-Chu; Kuo-Chen Lin; Sheng-Rong Huang, both of Hsinchu, all of Taiwan

[73] Assignee: Taiwan Semiconductor Manufacturing Company Ltd., Hsin-Chu, Taiwan

[21] Appl. No.: 735,059

[22] Filed: Oct. 18, 1996

[51] Int. Cl.⁶ .................................................. G06F 19/00
[52] U.S. Cl. ............................... 364/468.06; 364/468.28; 364/468.02
[58] Field of Search .................... 364/468.01–468.02, 364/468.05–468.12, 468.28

[56] References Cited

U.S. PATENT DOCUMENTS

| | | | |
|---|---|---|---|
| 5,099,431 | 3/1992 | Natarajan | 364/468 |
| 5,282,139 | 1/1994 | Kobayashi | 364/468 |
| 5,402,350 | 3/1995 | Kline | 364/468 |
| 5,444,632 | 8/1995 | Kline | 364/468 |
| 5,546,326 | 8/1996 | Tai | 364/552 |
| 5,559,710 | 9/1996 | Suauraray | 364/468.06 |
| 5,612,886 | 3/1997 | Weng | 364/468.07 |
| 5,706,200 | 1/1998 | Kumar | 364/468.05 |
| 5,745,364 | 4/1998 | Togashi | 364/468.28 |
| 5,748,478 | 5/1998 | Pan | 364/468.05 |
| 5,751,580 | 5/1998 | Chi | 364/468.07 |

*Primary Examiner*—Emanuel Todd Voeltz
*Assistant Examiner*—Richard H. Musgrove
*Attorney, Agent, or Firm*—George O. Saile; Stephen B. Ackerman; Graham S. Jones, II

[57] ABSTRACT

In a semiconductor manufacturing fabrication plant with production to-order type operation, hundreds of devices and various processes are managed. To provide short cycle time and precise delivery to satisfy customer expectations is a major task. A dispatching algorithm named "Required Turn Rate (RTR)" functions according to the level of current wafers in process (WIP) algorithm revising the due date for every lot to satisfy the demand from Master Production Scheduling (MPS). Further the RTR algorithm calculates the RTR of each lot based on process flow to fulfill the delivery requirement. The RTR algorithm determines not only due date and production priority of each lot, but also provides RTR for local dispatching. The local dispatching systems of each working area dispatch the lots by using required turn rate to maximize output and machines utilization.

20 Claims, 6 Drawing Sheets

$$\mathrm{FCLIP} = \left[ \sum_i X_i / Y \right] * 100\%$$

DYNAMIC LOT DISPATCHING REQUIRED TURN RATE FACTORY CONTROL SYSTEM AND METHOD OF OPERATION THEREOF

BACKGROUND OF THE INVENTION

1. Field of the Invention

This invention relates to automated factory control systems hardware and methods of operation thereof.

2. Description of Related Art

In a semiconductor manufacturing fabrication factory with a production-to-order type operation, control of hundreds of devices and various processes must be managed. There are always the major goals and tasks of providing short cycle times and precise delivery schedules for the purpose of satisfying expectations of customers. The difficulties encountered are a complex set of choices of process mix and of product mix, unscheduled machine down times and equipment arrangements. How to dispatch lots effectively has become a very important topic in handling manufacturing.

Characteristics of a foundry fabrication operation include customer service which involves on the one hand producing a quality product and service and on the other hand providing on time delivery. Functions of such an operation include a job-shop, a make-to-order function, mixed operation types, providing advanced technology, providing a complex product-mix and a re-entrant speciality of processing.

In the past, traditional dispatching methods like FIFO, critical ratio, least stack time and least queue time and so on have been investigated. For example, traditional SLACK policy has been employed in factory automation to control the long-term due date (DD) and the On Time Delivery (OTD) policy has been used to reflect the short-term stage queue time. A system employing the SLACK algorithm may control every lot to provide completion of the lot before the due date DD, but the quantity of supply sometimes becomes insufficient to meet demand because of delay of lots of work in process (WIP) being scrapped or lots being held back (e.g. wafers detained) during production.

Slack/OTD:
Advantages:
1. Control the production lots.
2. Decrease cycle time deviation.
Disadvantages:
1. No quantity control consideration.
2. No interface to local dispatch system.

The problem is that the traditional dispatching rules such as critical ratio, FIFO, least slack time and least queue time cannot provide a stable and satisfactory outcome. Simulation models can be used to evaluate those dispatching rules. However, because of the reentrant specialty of the IC fabrication process, the dispatching methods stated above can not provide stable and satisfactory outcomes. Furthermore considering the different operations specialties of every working area, such as batch-type operations in furnace area, sequential-type operations in etch and implant areas and the restriction of masks, photo resistors in the photolithography area, and traditional lot dispatching methods cannot satisfy the request in a sophisticated IC manufacturing environment.

The problem of how to dispatch lots effectively in such a complex environment has become very important to manufacturers.

SUMMARY OF THE INVENTION

An object of this invention is to reduce the risk of delivery, both in terms of lateness and inadequate quantity.

Another object of this invention is to reduce the response time when unforeseen events happen.

A further object of this invention is to monitor all aspects of the delivery status of the device.

Still another object of this invention is a link to local dispatching systems for different operation areas.

In accordance with this invention, a dispatching algorithm named "Required Turn Rate (RTR)" is developed. According to the level of current wafers in process (WIP). The RTR algorithm revises the due date DD for every lot to satisfy the demand from Master Production Scheduling (MPS). Further to calculate the required turn rate of each lot based on process flow to fulfill the delivery requirement. The RTR algorithm determines not only due date DD and production priority of each lot, but also provides required turn rate for local dispatching. Therefore, local dispatching systems of each working area will dispatch the lots by using required turn rate to maximize output and machines utilization.

In accordance with this invention, a method of operating an automated factory management of a fabrication plant using a computer system with a master production scheduling (MPS) system providing demand information, the method comprises the following steps. Provide lot data including a plurality of lot due dates (LDDs) collected from the fabrication plant and stored in a data storage device to a central processing unit and a current Work in Progress (WIP) list.

a) Revise each LDD for a lot by the steps as follows:

i) calculate the remaining process time to the LDD for each lot, ii) sort the current WIP list using the remaining process time to produce a sorted WIP list, iii) revise the LDD to satisfy current demand data from the MPS system according to the sorted WIP list, b) calculate critical ratios (CRs) for the lots, and c) sort the lots based upon the critical ratio to determine lot priority, and d) calculate a required turn rate (RTR) for each lot.

Preferably the critical ratio is calculated by the formula as follows:

$$CR = \frac{\text{Remaining Process Time (for Lot)}}{\text{Revised Due Date (for Lot)} - \text{Now}} \;;$$

the Required Turn Rate RTR system is determined in accordance with the formula as follows:

$$RTR = X_n - X_o + 1$$

where $X_o$: current stage number $X_n$: next nth-stage number; and $$\frac{\sum_{i=X_o}^{X_n} (\text{std\_stage\_cycle\_time})}{24 \text{ hours}} = CR \;;$$

and a plurality of priorities are provided as a function of critical ratios CRs as follows:

| CR order | Priority |
|---|---|
| First 25% | 1 |
| 25%–50% | 2 |
| 50%–75% | 3 |
| Last 25% | 4 | whereby the system has priorities ordered by the critical ratio.

Preferably, the method includes a Master Production Scheduling algorithm for revising the due date which commences by sorting of the Work In Progress (WIP) in which the lots being processed are sorted according to the due date. Perform a function of choosing the lot with the shortest remaining process time, and if a lot is completed, reporting the fact that a lot is completed on line to an MPS net demand function, the MPS net demand function combining inputs from a current wafer out input and a MPS Demand input. Test whether the MPS net demand is greater than zero. When the MPS net demand is not greater than zero then go to a slow down function which leads back to the function of choosing the lot. When the MPS net demand is greater than zero then revise the due date as the latest requirement date on the MPS schedule and updating the MPS net demand data function. Then the MPS demand function supplies check demand status data to a reporting and action function.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 3:
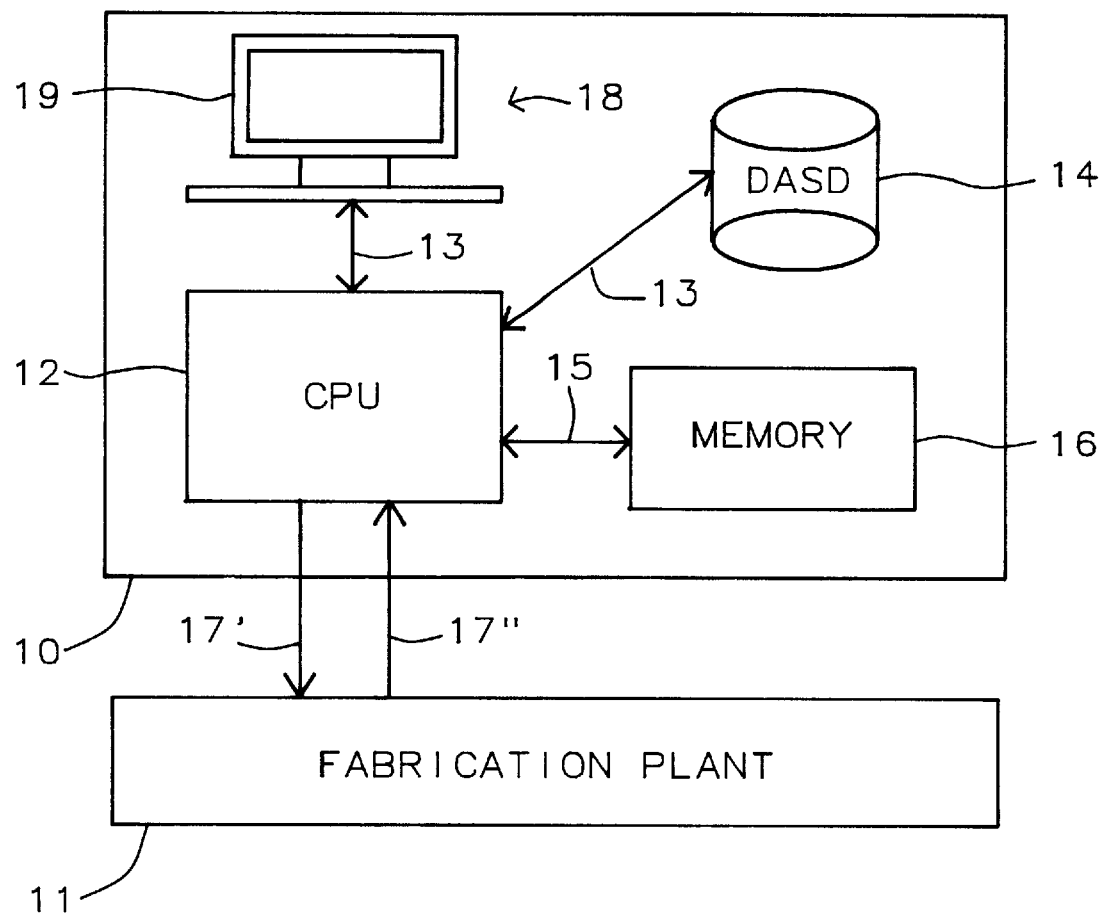
FIG. 3 includes a computer system and a fabrication plant, with the computer providing a manufacturing control system in accordance with this invention for the plant.

FIG. 3 shows a computer system 10 and a fabrication plant 11, with the computer 10 providing a manufacturing control system for the plant 11 in accordance with the method of this invention and providing a system in accordance with this invention. The computer 10 is connected to send control data on line 17' to the plant 11 and to receive feedback data on line 17" from the plant 11. A CPU 12 in computer 10 is connected by the lines 17' and 17" to the fabrication plant 11, as described above. The computer system 10 of FIG. 3 includes a Central Processing Unit (CPU) 12 which is connected by line 15 to a random access memory 16. CPU 12 is also connected, by line 13, to the Direct Access Storage Device (DASD) 14. In addition, a terminal 1B is connected to CPU 12 by line 17. Terminal 18 includes a video monitor 19. The computer 10 includes a Direct Access Storage Device (DASD) 14 which contains manufacturing control algorithms, which are loaded, as required, from the DASD 14 into the memory 16 to be employed by CPU 12 to perform the data processing functions required, in accordance with this invention.

Figure 1:
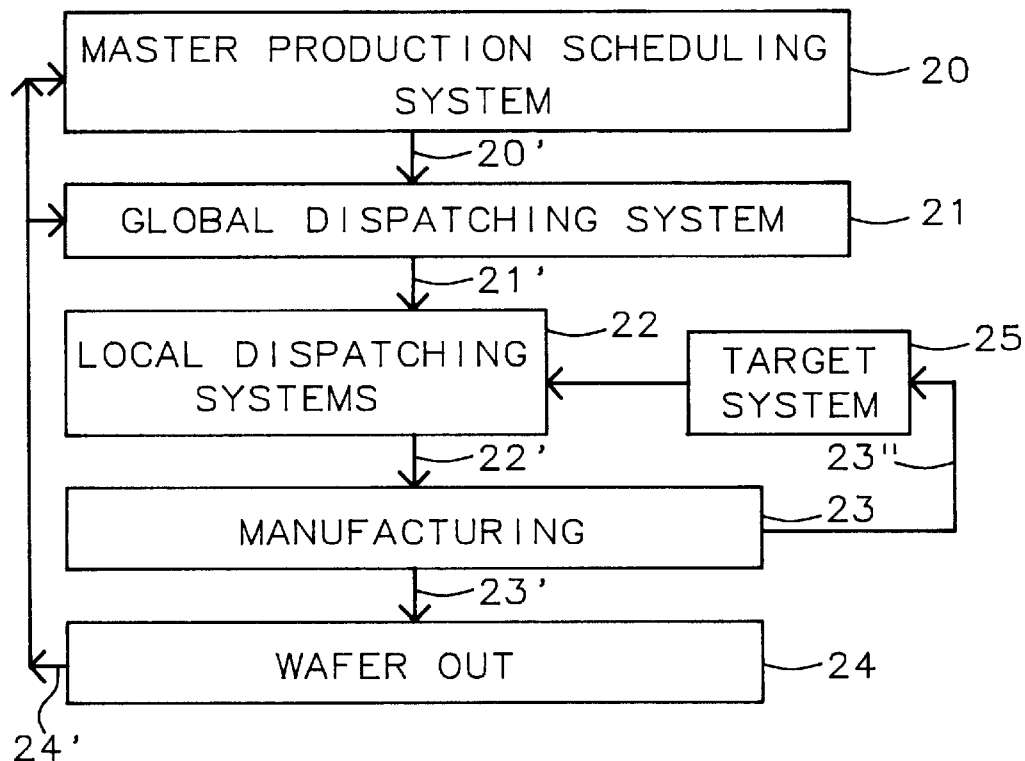
FIG. 1 shows the structure of an automatic fabrication plant control system in accordance with this invention which is divided into five levels.

FIG. 1 shows the structure of manufacturing control with an automatic fabrication plant control system in accordance with this invention which is divided into five levels.

The first level is the Production Planning level. In the first level is included a Master Production Scheduling (MPS) System 20. The MPS 20 arranges a customers order according to the capacity of the fabrication unit and the WIP status. The wafer start and wafer out schedule of every lot are defined in the MPS 20 and output data containing that information is supplied on line 20' to the global dispatching system 21 located in the second level of the manufacturing control system of FIG. 1.

The second level (Global Dispatching level) in FIG. 1 includes a Global Dispatching System (GDS) 21, wherein, according to MPS status above, the GDS readjusts the running speed of every lot in order to deliver each lot on time. The GDS decides lot priority and also provides in detail the Required Turn Rate (RTR) of every lot within the next 24hours for supporting the local dispatching system 22 in the third level. Global dispatching data is supplied on line 21' to the local dispatching system 22.

The third level (On-Line Control level) comprises an on-line control system. The third level contains two systems including a local dispatching system 22 (Photolithography, Furnace, Etching, . . . working area) and target system 25 (line balance control). Since there are reentrant processing steps in an IC process, there are many lots that are produced in different stages in the same area. Supplying lots to the next stages to prevent machines from "starving" (from inadequate workload) in order to attain the line balance (of the manufacturing line) is a very important factor in handling lot dispatching for each working area. The target system 25 both determines the daily target of each stage, and also keeps the line balanced. Line balance is the key factor to provide stable and maximal wafer output from the fabrication plant 11 of FIG. 3.

Figure 2:
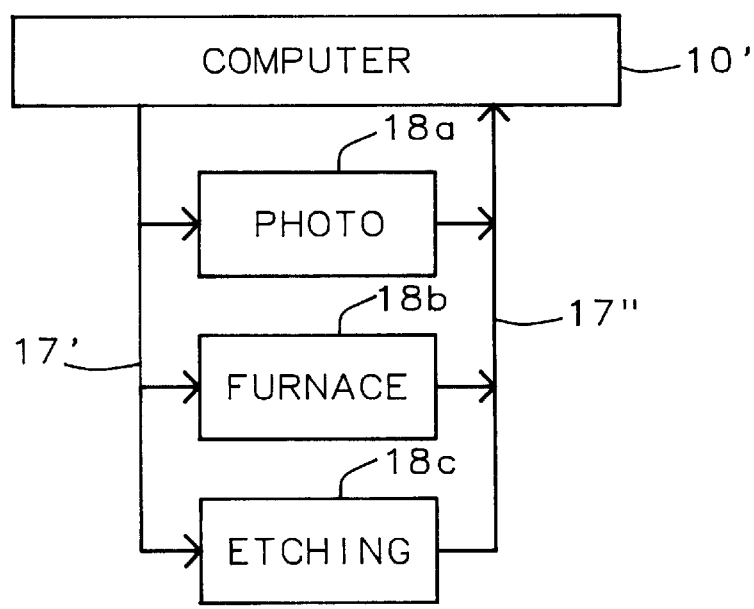
FIG. 2 shows a set of local dispatching systems with a computer connected thereto including a photolithography control unit, a furnace control unit and an etching control unit in the fabrication plant of FIG. 3.

FIG. 2 shows a set of local dispatching systems with a computer 10' (similar to integral with the computer 10 of FIG. 3) connected thereto including a photolithography control unit 18a, a furnace control unit 18b and an etching control unit 18c in the fabrication plant 11 of FIG. 3. Data is supplied from computer 10' to control units 18a–18c on line 17' and data from control units 18a–18c is supplied on line 17" to computer 10'.

Referring again to FIG. 1, the fourth level (Manufacturing level) is directed to control of manufacturing. Level four includes a manufacturing system 23. In connection with this invention, status data from the manufacturing system 23 is supplied on line 23" as feedback to the target system 25 for line balance control. Output data containing manufacturing information is supplied on line 23' to the wafer out system 24 located in the fifth (shipping) level of the system.

The fifth level (Shipping level) is the shipping level where the wafer out system 24 is provided. Sometimes, for some reason, some lots can not be completed on schedule. The wafer out information from system 24 is supplied as feedback data on line 24' to the GDS 21 and to modify the MPS system 20 to modify MPS system demand.

In accordance with this invention, in order to solve the problem of meeting delivery dates as stated above, the automatic fabrication plant control system is operated employing a control system implementing a dispatching method and system, named "Required Turn Rate (RTR)" is provided in accordance with this invention. The RTR method is implemented with a computer which controls the fabrication plant The RTR control system of this invention revises the due dates for each lot of wafers (hereinafter referred to as a lot) to be produced on the manufacturing line to satisfy the demand from a Master Production Scheduling (MPS) system, according to the level of current wafers being produced i.e. Work In Process (WIP).

In addition, the RTR system calculates the Required Turn Rate (RTR) for each lot-based on process flow for the purpose of fulfilling the delivery requirement.

The RTR system determines not only the due date and the production priority of each lot, but also provides the RTR for local dispatching systems 22 of FIG. 1. Therefore, the local dispatching systems 22 for each work area dispatch the lots of WIP by using the RTR to maximize output while also maximizing machine utilization.

In the RTR system, before manufacture of a lot is started, the system sets a due date (DD) for every lot in order to satisfy the demand from the Master Production Scheduling algorithm or to meet customer requests. Considering the projected line yield percentage, several percent more wafers are started to compensate for the yield loss, delays attributable to unexpected wafer scrap, wafers held due to processing problems, or other factors. Furthermore, since the IC market fluctuates rapidly, sometimes customers revise their orders (make change orders) as demand quantities change, thereby changing the demand quantity. Accordingly, the ability to revise the production plan in the shortest time possible is valued in market competition. Thus, a dynamic method of adjustment of the run time of every lot, to satisfy the demand from the MPS system, is an important goal of the semiconductor manufacturing industry.

Furthermore, for some devices the lots have a higher turn rate than other lots because of factors such as shorter cycle times or a WIP profile requiring a higher priority production schedule. A dispatching system should slow down the lots which are ahead of schedule, dynamically, to free some manufacturing capacity, in order that the system can reassign the free manufacturing capacity to accelerate processing of the lots that are behind schedule. In addition, some lots are behind schedule because of being held back deliberately. Assignment of other substitute lots and acceleration of the running speed thereof is extremely necessary in dynamic manufacturing control.

The SLACK policy is described in commonly assigned U.S. patent application Ser. No. 08/416,165 of Tai et al, filed Apr. 4, 1995, entitled "Dynamic Dispatching Rule that Uses Long Term Due Date and Short Term Queue Time to Improve Delivery Performance". Previously, the traditional SLACK policy has been used to control the long-term due date and On Time Delivery (OTD) policy to reflect the short-term stage queue time. This SLACK algorithm controls every lot to completion before the due date, but the demand quantities sometimes become insufficient because of wafers being scrapped or held during production.

In order to solve the problem stated above, the dispatching algorithm named "Required Turn Rate (RTR)" in accordance with this invention takes all of the above problems into account and provides a solution.

Usually a semiconductor manufacturing fabrication unit operates twenty-four (24) hours a day and the WIP status and output quantity varies constantly. Since the RTR algorithm calculation takes a few minutes to perform each time (varying according to the computer used) the WIP fluctuation is neglected during that period.

Figure 5:
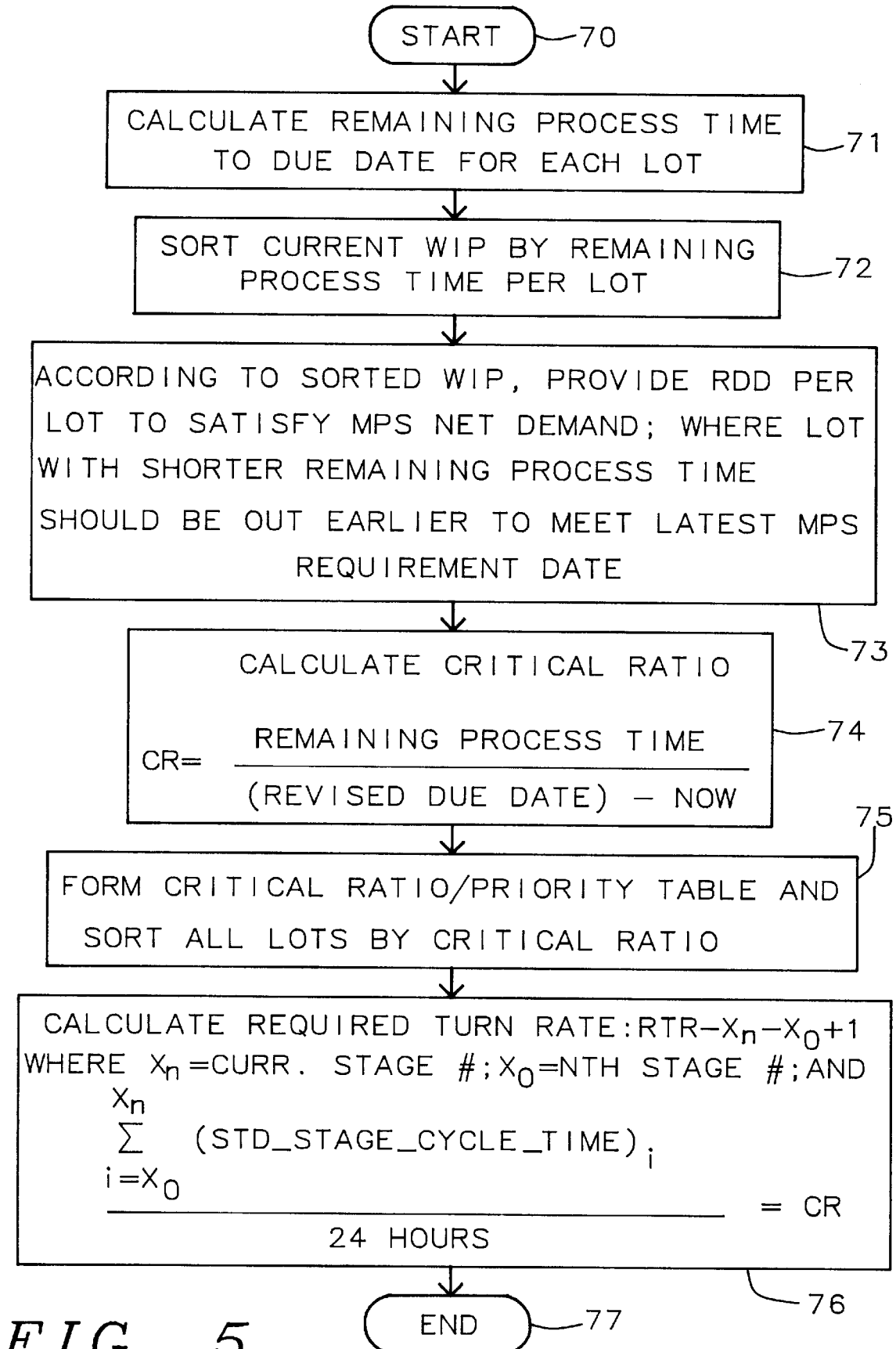
FIG. 5 is a flow chart of the RTR (Required Turn Rate) algorithm of this invention.

FIG. 5 is a flow chart of the RTR algorithm of this invention. The RTR algorithm begins with the start step 70.

Revise Due Date

In the initial three steps 71–73 of RTR algorithm shown in FIG. 5, the system reestimates the net demand of the MPS system 20 of FIG. 1 and then offers a new due date for each lot in order to satisfy the demand of MPS system 20. Supposing that RTR calculation generates a cycle once every six hours and there are some wafer lots have been scrapped during that period so that the total quantity of wafer lots is diminished, then, within six hours, the due date of adjacent lots will be revised to supply the requirement of MPS system 20. If the result shows that quantity of WIPs of the same device is insufficient; a message is sent automatically to request starting of more wafers to reflect the variation in demand for wafer quantity, as soon as possible.

Alternatively, if the actual line yield is higher than estimated; the due date can be delayed through providing a Revised Due Date (RDD) to slow down its turn rate TR. In an extreme case one or more lots can be terminated, as needed, in order to save manufacturing capacity and cost.

According to the revised due date RDD, the remaining time and remaining theoretical process time of every lot, the RTR algorithm calculates its Critical Ratio (CR) and therefore defines its lot priority. Then, based on the CR value stated above, the process flow and theoretical process time of each stage; the RTR algorithm of FIG. 5 computes the Required Turn Rate (RTR) for the next 24 hours for every lot.

The algorithm listing is as follows:

Step 1: Revise lot due date (DD)

a) In block 71, the system secures due date DD data from the memory 16 or DASD storage 14 and current status of the lots from memory 16 and calculates the remaining process time to due date (DD) of each lot.

b) In block 72, the result from block 71 is used to sort the current WIP using a sorting criterion of the remaining process time calculated above for every part.

c) In block 73, according to the sorted WIP, the computer 10 provides a Revised Due Dates (RDD's) for the lots to satisfy the current MPS net demand. A lot with shorter remaining process time should be out earlier to meet the latest MPS requirement date.

Step 2: Calculate the Critical Ratio for each lot to determine lot priority for each lot.

a) In block 74, the critical ratio is calculated by the equation as follows:

$$CR = \frac{\text{Remaining Process Time (for Lot)}}{\text{Revised Due Date (for Lot)} - \text{Now}}$$

Note: if CR=1 the lot can be processed at normal speed (i.e. standard cycle time)
 if CR>1 the lot should be processed faster than normal lots.
 if CR<1 the lot can be processed slower than normal lots.
 b) Next, in block 75, define the priority of lots in accordance with the parameters in Table I below.

TABLE I

| CR Order | Priority |
| --- | --- |
| First 25% | 1 |
| 25%–50% | 2 |
| 50%–75% | 3 |
| Last 25% | 4 |

Then using the parameters in table I, sort all lots according to their CR values.
Step 3: Calculate the Required Turn Rate (RTR):
 In block 76, the Required Turn Rate (RTR) equals the number of stages that should be passed in the coming one day and is defined as follows:
 RTR=$X_n$-$X_o$+1
 where
 $X_o$: current stage number
 $X_n$: next nth-stage number; and $$\frac{\sum_{i=X_o}^{X_n} (\text{std\_stage\_cycle\_time})}{24 \text{ hours}} = CR$$

Figure 6:
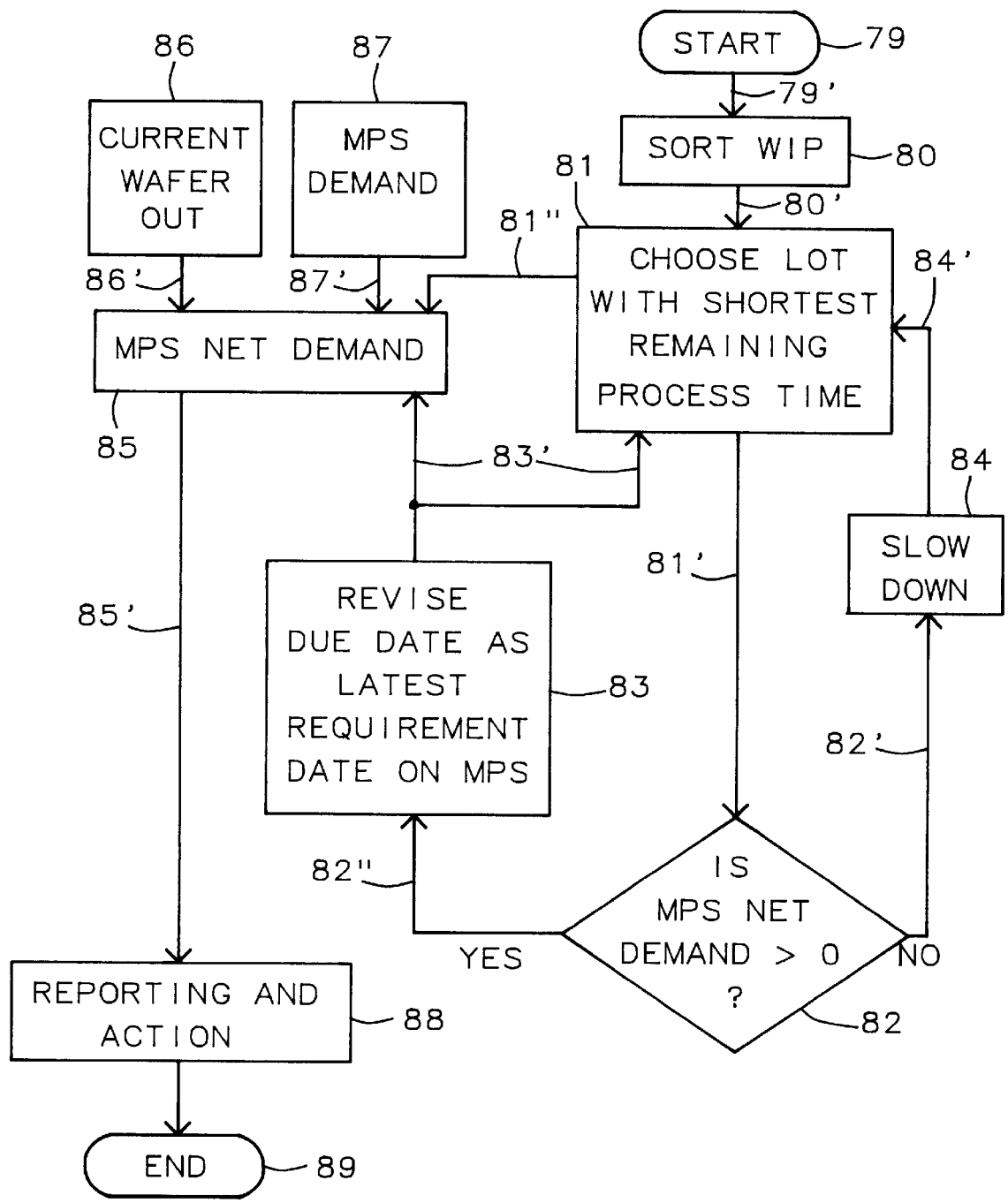
FIG. 6 is a flow chart an MPS demand algorithm in accordance with this invention, which commences the process in the Sort of the Work In Progress (WIP) block in which the lots being processed are sorted according to the due date.

Since the RTR value is the required turn rate for next 24 hours, it can be transferred as the due date for the stage where the lot is located.
 Therefore, from the stage viewpoint, local dispatching systems can calculate the schedule of lots as to when they should arrive and when they should be out. The local dispatching systems can dispatch the lots according to the stage due date.
 In accordance with this invention, FIG. 6 shows an algorithmic process stored in the DASD 14 which is loaded into the memory of computer 10 for by the CPU 12 and which is employed by the CPU 12 to perform a method in accordance with this invention.
 In FIG. 6 is a flow chart of the MPS (Master Production Scheduling) algorithm in accordance with this invention which begins at start block 79 which leads by line 79' to block 80 which commences the process in the Sort of the Work In Progress (WIP) block 80 in which the lots being processed are sorted according to the due date.
 After sorting line 80' leads to block 81 where CPU 12 chooses the lot with the shortest remaining process time. Next, the program goes from block 81 as indicated by line 81' to decision block 82 to test whether MPS Net Demand is greater than zero. Block 81 has an additional function, if a lot is completed, of reporting the fact that a lot is completed on line 81" to the MPS Net Demand block 85.
 When decision block 82 determines that Master Production Scheduling (MPS) Net Demand is not greater than zero then that fact leads from decision block 81 as indicated by line 82' to slow down block 84 which leads back via line 84' to block 81. Some lots have no demand, e.g. excess lots for possible lowered yield or lots made for use by engineering.

When decision block 82 determines that MPS Net Demand is greater than zero then that fact leads as indicated by line 82" to block 83 which revises the lot due dates as the latest requirement date on the MPS (Master Production Scheduling) schedule. The block 83 leads via line 83' back to block 81. Line 83' also leads to MPS net demand block 85 to update the MPS net demand data in block 85. Additional inputs to the block 85 come on line 86' from the Current Wafer Out block 86 and on line 87' from MPS Demand block 87.
 The MPS Demand block 85 supplies check demand status data on line 85' to the reporting and action block 88 which leads to the last step, the end of the program routine of FIG. 6 in block 89.

Evaluation of Whether Demand Met or Not, on a Daily Basis

Figure 4:
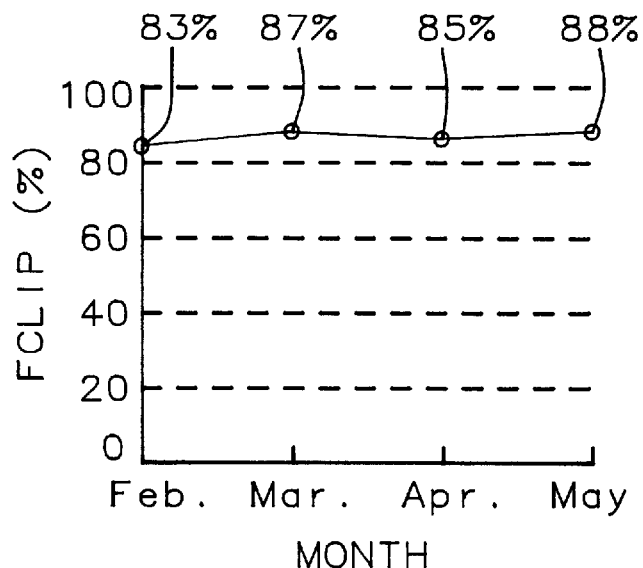
FIG. 4 is a chart showing the the results of use of the invention, indicating that the value of Fab Confirmed Line Item Performance (FCLIP), as described in greater detail in FIGS. 7A–7B.
Figures 7A, 7B:
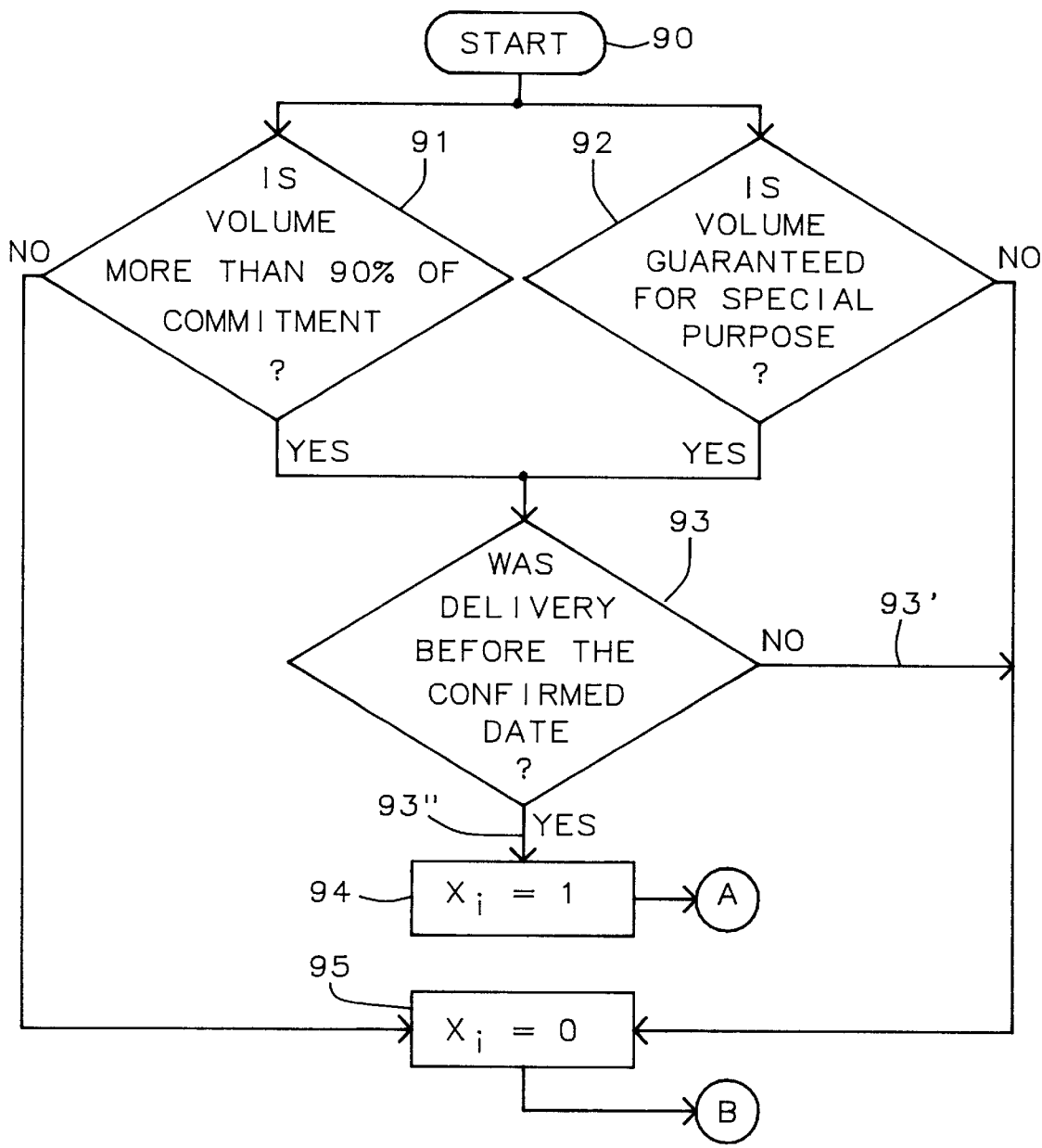
FIG. 7A shows the equation for determining the value of FCLIP.
FIGS. 7B and 7C show the steps of an algorithm for determining the value of Fab Confirmed Line Item Performance FCLIP.
Figure 7C:
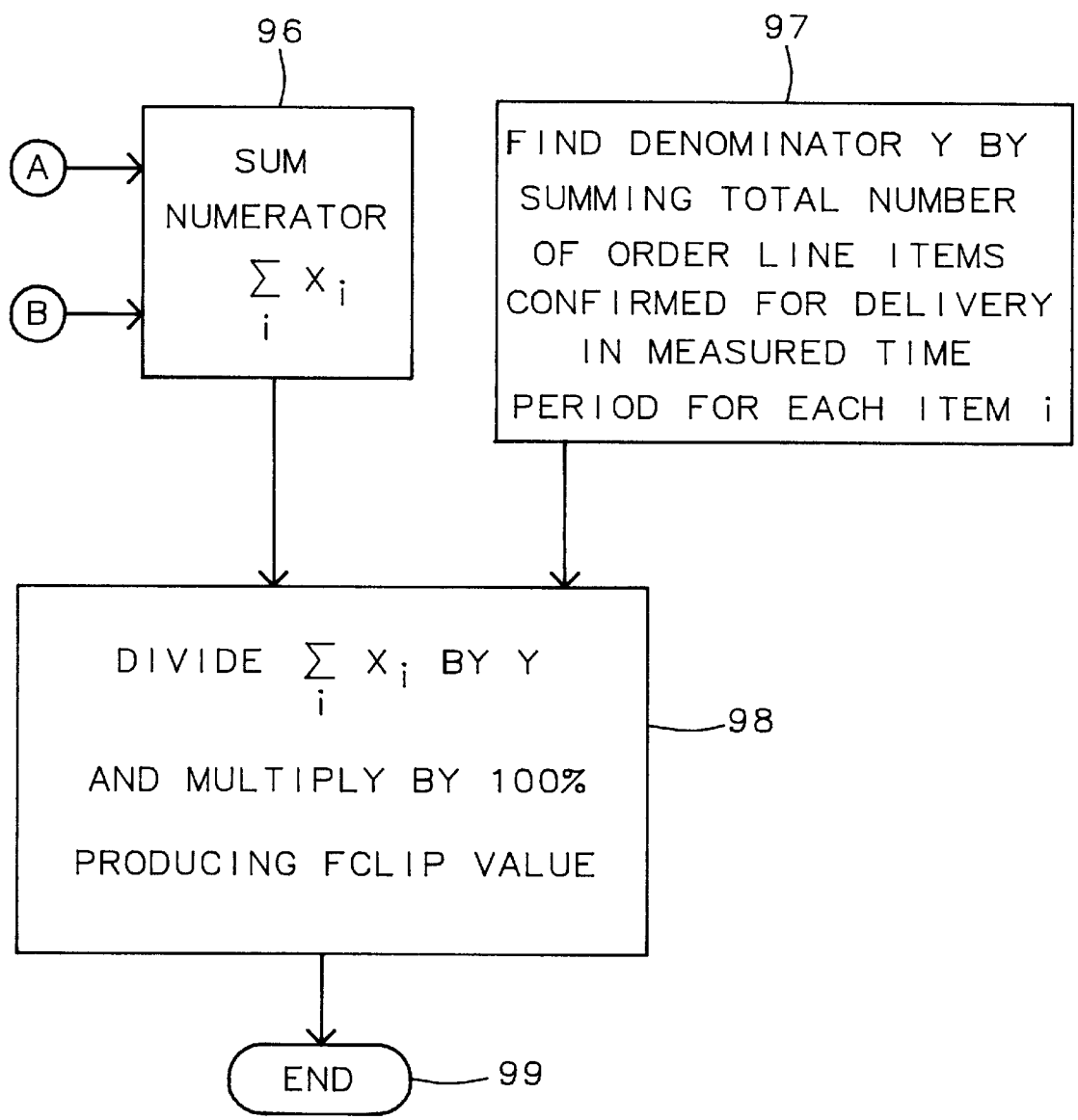

The RTR algorithm has been implemented in volume-production fabrication for several months and an index called FCLIP (Fabrication Confirmed Line Item Performance) was used to make an evaluation of the performance of the algorithm. FCLIP measures the Fabrication Unit output performance according to the MPS and wafers out.
 The definition of FCLIP, shown in FIG. 7A is as follows:

$$FCLIP = \left[ \frac{\sum_i X_i}{Y} \right] * 100\%$$

where Y=the total number of order line items, confirmed to deliver in the measured time period for each item i in Y.
 X=1, if delivered on or before confirmed date and delivery volume met one of the following conditions:
 a. more than 90% of commitment,
 b. guaranteed volume, for pilot, engineering or developing run order.
 $X_i$=0, otherwise.
 FIG. 4 is a chart showing the the results of use of the invention, indicating that the value of FCLIP increased from 83% in Feb. to 88% in May and the trend was up as seen in FIG. 4. Since the RTR algorithm can revise due dates DD of the lot, it brings the lots out no only on time, but also provides enough quantity to satisfy demand by customers. Thus the RTR algorithm has a positive effect on FCLIP.
 FIG. 7A shows the equation for determining the value of FCLIP.
 FIGS. 7B and 7C shows an algorithm for determining the value of Fab Confirmed Line Item Performance FCLIP.
 The FCLIP equation, shown in FIG. 7A, is solved by the FCLIP algorithm, shown in FIGS. 7B and 7C, starting in FIG. 7B with the start block 90 which leads to the tests in decision blocks 91 and 92. Decision block 91 determines whether volume is more than 90% of commitment. Decision block 92 determines whether the volume is guaranteed for a special purpose. If either decision block 91 or 92 answers YES, then the program proceeds to decision block 93.
 Decision block 91 determines whether the delivery was before the confirmed date.
 If the response to either decision block 91, 92 or 93 is NO, then the program proceeds to block 95 for $X_i$=0 which is output to connector B to FIG. 7B which is an input to SUM Numerator block 95 in FIG. 7C.
 If the response to either decision block 93 is YES, then the program proceeds to block 94 for $X_i$=1 which is output to connector A to FIG. 7B which is a second input to SUM Numerator block 95 in FIG. 7C which sums the value as follows:

$$\sum_i X_i$$

The above sum is supplied to block 98 as the numerator of the equation which is employed in the equation for FCLIP in FIG. 7A.

Next, in FIG. 7C, the block 97 finds the denominator which is the total number of order line items, confirmed to be delivered in the measured time period for each item i in Y and the output is supplied to block 98, where the value of FCLIP is determined by dividing the value summed in block 96 by the value provided as a denominator in block 97. That result is multiplied by 100% to form a percentage, and the final step is that the program ends at block 99.

Advantages of the RTR algorithm are as follows:
1. Transfer RTR as Stage due date for local dispatching
2. Estimate Daily Capacity
3. Allocate Machines Capacity An example of the present invention is illustrated by Tables II, III and IV which show MPS Demand, Actual Wafer Out and MPS Net Demand for three products P1, P2 and P3 from Sept. 21 to Sept. 30 based upon the date of Sept. 24 being "Today". For example, on Sept. 21, there was a demand for 24 P1 wafers and 24 P1 and P2 wafers were out.

TABLE II

MPS Demand:

| Prod | 9/21 | 9/22 | 9/23 | Today 9/24 | 9/25 | 9/26 | 9/27 | 9/28 | 9/29 | 9/30 | Total |
|---|---|---|---|---|---|---|---|---|---|---|---|
| P1 | 24 | | | 24 | | | 24 | | | | 72 |
| P2 | | 48 | | | 48 | | | 48 | | 24 | 168 |
| P3 | | | 48 | | | 24 | | | 24 | | 96 |

TABLE III

Actual Wafer Out:

| Prod | 9/21 | 9/22 | 9/23 | Today 9/24 | 9/25 | 9/26 | 9/27 | 9/28 | 9/29 | 9/30 | Total |
|---|---|---|---|---|---|---|---|---|---|---|---|
| P1 | 24 | | 24 | | | | | | | | 48 |
| P2 | 24 | 24 | | | | | | | | | 48 |
| P3 | | | 24 | | | | | | | | 24 |

TABLE IV

MPS Net Demand:

| Prod | 9/21 | 9/22 | 9/23 | Today 9/24 | 9/25 | 9/26 | 9/27 | 9/28 | 9/29 | 9/30 | Total |
|---|---|---|---|---|---|---|---|---|---|---|---|
| P1 | | | | | | | 24 | | | | 24 |
| P2 | | | | | 48 | | | 48 | | 24 | 120 |
| P3 | | | 24 | | | 24 | | | 24 | | 72 |

Additional data for the example of Tables II–IV is shown in greater detail in Tables V and VI below.

TABLE V

| WIP STATUS: | | | | | | | | TIME: 9/24, 07:00 |
|---|---|---|---|---|---|---|---|---|
| Prod | Stage | LOTID | Plan Date Out | Revised Date Out | Theoretical Cycle Time | Remaining Days | CR | Priority Status |
| P1 | | P1001 | 9/21 | | | | | 9/21 Out |
| P1 | | P1002 | 9/24 | | | | | 9/23 Out |
| P1 | M2-ET | P1003 | 9/27 | 9/27 | 3.99 | 3 | 1.33 | 1 |
| P2 | | P2001 | 9/22 | | | | | 9/21 Out |
| P2 | | P2002 | 9/22 | | | | | 9/22 Out |
| P2 | WAT | P2003 | 9/25 | 9/25 | 1.25 | 1 | 1.25 | 2 |
| P2 | | P2004 | 9/25 | | | | | Scrapped |
| P2 | PA2-ET | P2005 | 9/28 | 9/25 | 2.04 | 1 | 2.04 | 1 [1] |
| P2 | M2-PH | P2006 | 9/28 | 9/28 | 4.71 | 4 | 1.18 | 3 |
| P2 | PA2-PH | P2007 | 9/30 | 9/28 | 2.73 | 4 | 0.68 | 4 |
| P2 | M2-SPU | P2008 | 10/5 | 9/30 | 5.18 | 4 | 1.30 | 2 |

TABLE V-continued

WIP STATUS:　　　　　　　　　　　　　　　　　　　　TIME: 9/24, 07:00

| Prod | Stage | LOTID | Plan Date Out | Revised Date Out | Theoretical Cycle Time | Remaining Days | CR | Priority | Status | |
|---|---|---|---|---|---|---|---|---|---|---|
| P3 | | P3001 | 9/23 | | | | | | 9/23 Out | |
| P3 | WAT | P3002 | 9/23 | 9/23 | 1.25 | | ∞ | 1 | *Delay* | [2] |
| P3 | ALLOY2 | P3003 | 9/26 | 9/26 | 1.37 | 2 | 0.69 | 4 | | |
| P3 | M2-ET | P3004 | 9/29 | 9/29 | 3.99 | 5 | 0.80 | 3 | | |

Notes:
[1] Substitute for scrapped lot, therefore priority = 1.
[2] Due since yesterday, therefore priority = 1.

TABLE VI

WIP:　　　　　　　　　　　Time: 9/24, 07:00

| Prod | Stage | LOTID | Stg. C/T | CH | RTR |
|---|---|---|---|---|---|
| P1 | M2-ET | P1003 | 0.66 | 1.33 | 3.12 |
| | PA2-OX | | 0.21 | | |
| | PA2-SIN | | 0.38 | | |
| | PA2-PH | | 0.69 | | |
| P2 | M2-SPU | P2008 | 0.48 | 1.30 | 2.16 |
| P2 | M2-PH | P2006 | 0.72 | 1.18 | 1.70 |
| | M2-ET | | 0.66 | | |
| P2 | PA2-PH | P2007 | 0.69 | 0.68 | 0.99 |
| P2 | PA2-ET | P2005 | 0.67 | 2.04 | 5.00 |
| P2 | WAT | P2003 | 0.68 | 1.25 | 3.00 |
| | BK-GRIND | | 0.23 | | |
| | QC-INSP | | 0.34 | | |
| P3 | M2-ET | P3004 | 0.66 | 0.80 | 1.67 |
| | PA2-OX | | 0.21 | | |
| P3 | ALLOY2 | P3003 | 0.12 | 0.69 | 1.84 |
| P3 | WAT | P3002 | 0.68 | ∞ | ∞ |

Conclusion:

In semiconductor foundry fabrication, there are several important factors such as quality of performance or targets dates pertinent to lot dispatching such as delivery, production cycle time, machine utilization, line balance and so on. The RTR algorithm controls delivery and controls the target system to keep the production line balance. The RTR algorithm combines the MPS demand and wafer out information to control the WIP dynamically in a short period. It provides a method for lot dispatching including the required turn rate for any special dispatching considerations in local working area.

The RTR system automatically revises the due date of every lot according to the MPS system. Then, the Critical Ratio (CR) is calculated to define the level of production priority based on the revised due date and process steps remaining.

By using the Critical Ratio (CR) and the standard cycle time, the RTR control system further figures precisely how many stages a lot should penetrate (pass through) during one day so the Required Turn Rate (RTR) can fulfill the demand from the MPS system. The RTR control system also provides the information for local dispatching systems.

Required Turn Rate System

Dispatching Considerations:
1. Satisfy-the MPS system demand.
2. Control all production lots.
3. Satisfy all requirements for any special local dispatching system.
4. Maximize fabrication factory output (line balance.)

RTR System Benefits:
1. Control the production lots.
2. Decrease cycle time deviation.
3. Satisfy the the MPS system demand.
4. Warning special events, e.g. insufficient quantity.
5. Support local dispatching module.

Future: Line balance methodology development.

| | Keywords Explanation |
|---|---|
| CR | \~Critical Ratio = $\frac{RPT}{RDD - T_o}$\~ |
| DD | Due_Date |
| Due_Date | Scheduled due date from MPS |
| DTR | Average Number of Stages through which WIP moves in one day |
| Fab | Fabrication Plant |
| FCLIP | Fab Confirmed Line Item Performance) |
| FFOT | (Forecast_FAB_Out_Time) = Refers to statistical Information and queueing theory to obtain a steady standard out time. |
| FIFO | First In First Out |
| GDS | Global Dispatching System |
| IC | Integrated Circuit |
| MPS | Master Production Scheduling |
| OTD | On Time Delivery |
| Part | product or device. |
| Part Flow | process flow or product flow |
| Penetrate | pass through one or more stages |
| MPS | Master Production Scheduling (MPS) system |
| RDD | Revised Due Date |
| RPT | Remaining Process Time |
| RTR | Required Turn Rate = Required DTR = Number of Stages which should be passed in one day Stage group of process steps or recipes, different processes may have the same stage |
| SLACK | (Due_Date) − (Now) − (FFOT) |
| Sorting Order | Stage sorting order |
| Stage | Stage is a set of 1 or more process steps |
| $T_o$ | Time Now or Time "0" |
| TR | Turn Rate = # of Stages Passed/Day |
| WAT | Wafer Accept and Test |
| WIP | Work In Progress. |
| WIP profile | Special WIP Schedule |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of operating an automated factory management of a fabrication plant using a computer with a Master Production Scheduling (MPS) system providing demand information, said method comprising the steps as follows:

providing lot data including a plurality of lot due dates (LDDS) collected from said fabrication plant and stored in A data storage device to a central processing unit and a current Work in Progress (WIP) list, a) revising each said LDD for a said lot by the steps as follows:
      i) calculating the remaining process time to a LDD of said LDDs for each lot,
      ii) sorting said current WIP list using said remaining process time to produce a sorted WIP list,
      iii) revising said LDDs to satisfy current demand data from said MPS system according to said sorted WIP list,
   b) calculating critical ratios (CRs) for said lots, and
   c) sorting said lots based upon said critical ratio to determine lot priority, and
   d) calculating a required turn rate (RTR) for each lot.

2. A method in accordance with claim 1 wherein said critical ratio between a Due Date and Now is calculated by the formula as follows:

$$CR = \frac{\text{Remaining Process Time (for Lot)}}{\text{Revised Due Date (for Lot)} - \text{Now}}.$$

3. A method in accordance with claim 1 wherein a said Required Turn Rate RTR is determined in accordance with the formula as follows:

$$RTR = X_n - X_o + 1$$

where $X_o$: current stage number
$X_n$: next nth-stage number; and $$\frac{\sum_{i=X_o}^{X_n} (std\_stage\_cycle\_time)}{24 \text{ hours}} = CR.$$

4. A method in accordance with claim 1 wherein said critical ratio is calculated by the formula as follows:

$$CR = \frac{\text{Remaining Process Time (for Lot)}}{\text{Revised Due Date (for Lot)} - \text{Now}}$$

and said Required Turn Rate RTR is determined in accordance with the formula as follows:

$$RTR = X_n - X_o + 1; \text{ where}$$

$X_o$: current stage number
$X_n$: next nth-stage number; and $$\frac{\sum_{i=X_o}^{X_n} (std\_stage\_cycle\_time)}{24 \text{ hours}} = CR$$

5. A method in accordance with claim 1 wherein a plurality of priorities are provided as a function of critical ratios CRs as follows:

| CR order | Priority |
|---|---|
| First 25% | 1 |
| 25%–50% | 2 |
| 50%–75% | 3 |
| Last 25% | 4 | whereby said system has priorities ordered by said critical ratios.

6. A method in accordance with claim 1 wherein said critical ratio between a Due Date and Now is calculated by the formula as follows:

$$CR = \frac{\text{Remaining Process Time (for Lot)}}{\text{Revised Due Date (for Lot)} - \text{Now}}$$

and a plurality of priorities are provided as a function of critical ratios CRs as follows:

| CR order | Priority |
|---|---|
| First 25% | 1 |
| 25%–50% | 2 |
| 50%–75% | 3 |
| Last 25% | 4 | whereby said system has priorities ordered by said critical ratios.

7. A method in accordance with claim 1 wherein a said Required Turn Rate RTR is determined in accordance with the formula as follows:

$$RTR = X_n - X_o + 1, \text{ where}$$

$X_o$: current stage number
$X_n$: next nth-stage number; and $$\frac{\sum_{i=X_o}^{X_n} (std\_stage\_cycle\_time)}{24 \text{ hours}} = CR$$

and a plurality of priorities are provided as a function of critical ratios CRs as follows:

| CR order | Priority |
|---|---|
| First 25% | 1 |
| 25%–50% | 2 |
| 50%–75% | 3 |
| Last 25% | 4 | whereby said system has priorities ordered by said critical ratios.

8. A method in accordance with claim 1 wherein said critical ratio between a Due Date and Nowis calculated by the formula as follows:

$$CR = \frac{\text{Remaining Process Time (for Lot)}}{\text{Revised Due Date (for Lot)} - \text{Now}};$$

said Required Turn Rate RTR is determined in accordance with the formula as follows:

$$RTR = X_n - X_o + 1, \text{ where}$$

$X_o$: current stage number
$X_n$: next nth-stage number; and $$\frac{\sum_{i=X_o}^{X_n}(std\_stage\_cycle\_time)}{24 \text{ hours}} = CR;$$

and a plurality of priorities are provided as a function of critical ratios CRs as follows:

| CR order | Priority |
|---|---|
| First 25% | 1 |
| 25%–50% | 2 |
| 50%–75% | 3 |
| Last 25% | 4 | whereby said system has priorities ordered by said critical ratios.

9. A method in accordance with claim 1 wherein said method includes a Master Production Scheduling (MPS) algorithm for revising said lot due dates which commences by sorting of the Work In Progress (WIP) in which the lots being processed are sorted according to said lot due dates, performing a function choosing the lot with the shortest remaining process time, and if a lot is completed, reporting the fact that a lot is completed on line to an MPS net demand function, said MPS net demand function combining inputs from a current wafer out input and a MPS Demand input, testing whether said MPS net demand is greater than zero, when said MPS net demand is not greater than zero, then going to a slow down function which leads back to said function of choosing a lot, when said MPS net demand is greater than zero, then revising one of said lot due dates as the latest requirement date on said MPS schedule and updating said MPS net demand data function, and said MPS demand function supplying check demand status data to a reporting and action function.

10. A method in accordance with claim 8 wherein said method includes a Master Production Scheduling (MPS) algorithm for revising said due date which commences by sorting of the Work In Progress (WIP) in which the lots being processed are sorted according to the due date, performing a function choosing a lot with the shortest remaining process time, and if a lot is completed, reporting the fact that a lot is completed on line to an MPS net demand function, said MPS net demand function combining inputs from a current wafer out input and a MPS Demand input, testing whether said MPS net demand is greater than zero, when said MPS net demand is not greater than zero then going to a slow down function which leads back to said function of choosing a lot, when said MPS net demand is greater than zero then revising one of said lot due dates as the latest requirement date on said MPS schedule and updating said MPS net demand data function, and said MPS demand function supplying check demand status data to a reporting and action function.

11. A system for operating an automated factory management of a fabrication plant using a computer system with a Master Production Scheduling (MPS) system providing demand information, said method comprising as follows:

means for providing lot data including a plurality of lot due dates (LDDs) collected from said fabrication plant and stored in a data storage device to a central processing unit and a current Work in Progress (WIP) list, a) means for revising each said LDD for a said lot by the means as follows:
   i) means for calculating the remaining process time to the LDD for each lot,
   ii) means for sorting said current WIP list using said remaining process time to produce a sorted WIP list,
   iii) means for revising said LDD to satisfy current demand data from said MPS system according to said sorted WIP list,
b) means for calculating critical ratios (CRs) for said lots,
c) means for sorting said lots based upon said critical ratio to determine lot priority, and
d) means for calculating a required turn rate (RTR) for each lot.

12. A system in accordance with claim 11 wherein said critical ratio between a Due Date and Now is calculated by the formula as follows:

$$CR = \frac{\text{Remaining Process Time (for Lot)}}{\text{Revised Due Date (for Lot)} - \text{Now}}$$

13. A system in accordance with claim 11 wherein a said Required Turn Rate RTR is determined in accordance with the formula as follows:

$RTR = X_n - X_o + 1$, where $X_o$: current stage number
$X_n$: next nth-stage number; and $$\frac{\sum_{i=X_o}^{X_n}(std\_stage\_cycle\_time)}{24 \text{ hours}} = CR.$$

14. A system in accordance with claim 11 wherein said critical ratio is calculated by the formula as follows:

$$CR = \frac{\text{Remaining Process Time (for Lot)}}{\text{Revised Due Date (for Lot)} - \text{Now}}$$

and said Required Turn Rate RTR is determined in accordance with the formula as follows:

$RTR = X_n - X_o + 1$, where $X_o$: current stage number
$X_n$: next nth-stage number; and $$\frac{\sum_{i=X_o}^{X_n}(std\_stage\_cycle\_time)}{24 \text{ hours}} = CR.$$

15. A system in accordance with claim 11 wherein a plurality of priorities are provided as a function of critical ratios CRs as follows:

| CR order  | Priority |
|-----------|----------|
| First 25% | 1        |
| 25%–50%   | 2        |
| 50%–75%   | 3        |
| Last 25%  | 4        | whereby said system has priorities ordered by said critical ratio.

16. A system in accordance with claim 11 wherein said critical ratio between a Due Date and Now is calculated by the formula as follows:

$$CR = \frac{\text{Remaining Process Time (for Lot)}}{\text{Revised Due Date (for Lot)} - \text{Now}}$$

and a plurality of priorities are provided as a function of critical ratios CRs as follows:

| CR order  | Priority |
|-----------|----------|
| First 25% | 1        |
| 25%–50%   | 2        |
| 50%–75%   | 3        |
| Last 25%  | 4        | whereby said system has priorities ordered by said critical ratio.

17. A system in accordance with claim 11 wherein a said Required Turn Rate RTR is determined in accordance with the formula as follows:

$$RTR = X_n - X_o + 1, \text{ where}$$

$X_o$: current stage number
$X_n$: next nth-stage number; and $$\frac{\sum_{i=X_o}^{X_n} (\text{std\_stage\_cycle\_time})}{24 \text{ hours}} = CR$$

and a plurality of priorities are provided as a function of critical ratios CRs as follows:

| CR order  | Priority |
|-----------|----------|
| First 25% | 1        |
| 25%–50%   | 2        |
| 50%–75%   | 3        |
| Last 25%  | 4        | whereby said system has priorities ordered by said critical ratio.

18. A system in accordance with claim 11 wherein said critical ratio between a Due Date and Now is calculated by the formula as follows:

$$CR = \frac{\text{Remaining Process Time (for Lot)}}{\text{Revised Due Date (for Lot)} - \text{Now}};$$

said Required Turn Rate RTR is determined in accordance with the formula as follows:

$$RTR = X_n - X_o + 1, \text{ where}$$

$X_o$: current stage number
$X_n$: next nth-stage number; and $$\frac{\sum_{i=X_o}^{X_n} (\text{std\_stage\_cycle\_time})}{24 \text{ hours}} = CR;$$

and a plurality of priorities are provided as a function of critical ratios CRs as follows:

| CR order  | Priority |
|-----------|----------|
| First 25% | 1        |
| 25%–50%   | 2        |
| 50%–75%   | 3        |
| Last 25%  | 4        | whereby said system has priorities ordered by said critical ratio.

19. A system in accordance with claim 11 wherein said system includes a Master Production Scheduling (MPS) algorithm for revising said lot due dates which commences by sorting of the Work In Progress (WIP) in which the lots being processed are sorted according to said lot due dates,
   means for choosing a lot with the shortest remaining process time, and if a lot is completed, reporting the fact that a lot is completed on line to an MPS net demand function, said MPS net demand function combining inputs from a current wafer out input and a MPS Demand input,
   means for testing whether said MPS net demand is greater than zero,
   means for slowing down when said MPS net demand is not greater than zero then which leads back to said function of choosing a lot,
   means for revising one of said lot due dates as the latest requirement date on said MPS schedule and updating said MPS net demand data function when said MPS net demand is greater than zero, and
   said MPS demand function supplying check demand status data to a reporting and action function.

20. A system in accordance with claim 18 wherein said system includes a Master Production Scheduling (MPS) algorithm for revising said due date which commences by sorting of the Work In Progress (WIP) in which the lots being processed are sorted according to the due date,
   means for choosing a lot with the shortest remaining process time, and if a lot is completed, reporting the fact that a lot is completed on line to an MPS net demand function, said MPS net demand function combining inputs from a current wafer out input and a MPS Demand input,
   means for testing whether said MPS net demand is greater than zero,
   means for slowing down when said MPS net demand is not greater than zero then which leads back to said function of choosing a lot,
   means for revising one of said lot due dates as the latest requirement date on said MPS schedule and updating said MPS net demand data function when said MPS net demand is greater than zero, and
   said MPS demand function supplying check demand status data to a reporting and action function.

* * * * *